(12) United States Patent
Stonelake et al.

(10) Patent No.: US 11,544,207 B2
(45) Date of Patent: *Jan. 3, 2023

(54) SYNCHRONOUS MEMORY BUS ACCESS TO STORAGE MEDIA

(71) Applicant: Micron Technology, Inc., Boise, ID (US)

(72) Inventors: Paul Stonelake, San Jose, CA (US); Bryan Theodore Silbermann, San Mateo, CA (US); Frank F. Ross, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/321,353

(22) Filed: May 14, 2021

(65) Prior Publication Data
US 2021/0271617 A1    Sep. 2, 2021

Related U.S. Application Data

(63) Continuation of application No. 16/157,900, filed on Oct. 11, 2018, now Pat. No. 11,030,132.
(Continued)

(51) Int. Cl.
*G06F 13/16* (2006.01)
*G11C 11/406* (2006.01)
(Continued)

(52) U.S. Cl.
CPC ...... *G06F 13/1689* (2013.01); *G06F 12/1009* (2013.01); *G06F 13/1673* (2013.01);
(Continued)

(58) Field of Classification Search
CPC ............. G06F 13/1689; G06F 13/1673; G06F 12/1009; G06F 13/4243; G06F 2212/7201;
(Continued)

(56) References Cited

U.S. PATENT DOCUMENTS 5,943,681 A   8/1999 Ooishi
6,330,625 B1  12/2001 Bridge
(Continued)

FOREIGN PATENT DOCUMENTS

WO    2017065748    4/2017

OTHER PUBLICATIONS

Anonymous, "Hypervisor—Wikipedia," retrieved from the Internet <https://en.wikipedia.org/w/index.php?title=Hypervisor&oldid=811266280>on Apr. 15, 2021. Nov. 20, 2017.
(Continued)

*Primary Examiner* — Idriss N Alrobaye
*Assistant Examiner* — Henry W Yu
(74) *Attorney, Agent, or Firm* — Greenberg Traurig

(57) ABSTRACT

A computing system having memory components, including first memory and second memory, wherein the first memory is available to a host system for read and write access over a memory bus during one or more of a first plurality of windows. The computing system further includes a processing device, operatively coupled with the memory components, to: receive, from a driver of the host system, a request regarding a page of data stored in the second memory; responsive to the request, transfer the page from the second memory to a buffer; and write the page from the buffer to the first memory, wherein the page is written to the first memory during at least one of a second plurality of windows corresponding to a refresh timing for the memory bus, and the refresh timing is controlled at the host system.

20 Claims, 6 Drawing Sheets

Related U.S. Application Data

(60) Provisional application No. 62/626,577, filed on Feb. 5, 2018.

(51) Int. Cl.
*G06F 12/1009* (2016.01)
*G06F 13/42* (2006.01)
*G06F 12/02* (2006.01)
*G06F 13/20* (2006.01)

(52) U.S. Cl.
CPC .... *G06F 13/4243* (2013.01); *G11C 11/40607* (2013.01); *G11C 11/40611* (2013.01)

(58) Field of Classification Search
CPC ..... G06F 2212/7203; G06F 2212/1024; G06F 12/0246; G06F 13/16; G06F 13/20; G06F 12/023; G11C 11/40607; G11C 11/40611
USPC ...................... 710/33, 52, 310; 711/118, 147
See application file for complete search history.

(56) References Cited

U.S. PATENT DOCUMENTS

| | | |
|---|---|---|
| 6,601,141 B2 | 7/2003 | Ooishi |
| 6,728,834 B2 | 4/2004 | Stone et al. |
| 6,766,448 B2 | 7/2004 | Kubota |
| 7,962,686 B1 | 6/2011 | Tracht |
| 8,725,927 B2 | 5/2014 | Manning |
| 11,030,132 B2 | 6/2021 | Stonelake et al. |
| 2002/0185337 A1 | 12/2002 | Miura et al. |
| 2008/0307126 A1 | 12/2008 | Chou |
| 2009/0113085 A1 | 4/2009 | Banyai et al. |
| 2014/0075107 A1 | 3/2014 | Qawami et al. |
| 2014/0181364 A1 | 6/2014 | Berke et al. |
| 2014/0258604 A1 | 9/2014 | Asnaashar |
| 2014/0281365 A1 | 9/2014 | Mashey et al. |
| 2015/0339245 A1 | 11/2015 | Chakraborty et al. |
| 2016/0019138 A1 | 1/2016 | Lee |
| 2016/0365138 A1 | 12/2016 | Cho |
| 2017/0200498 A1 | 7/2017 | Shallal et al. |
| 2018/0293189 A1 | 10/2018 | Bacchus et al. |
| 2019/0243788 A1 | 8/2019 | Stonelake et al. |

OTHER PUBLICATIONS

Anonymous, "Virtual Memory—Wikipedia," retrieved from the Internet <https://en.wikipedia.org/w/index.php?title=Virtual_memory&oldid=823002175> on Apr. 15, 2021. Jan. 29, 2018.

Extended European Search Report, EP19747315.0, dated Apr. 23, 2021.

International Search Report and Written Opinion, PCT/US2019/014827, dated May 1, 2019.

SYNCHRONOUS MEMORY BUS ACCESS TO STORAGE MEDIA

RELATED APPLICATIONS

The present application is a continuation application of U.S. patent application Ser. No. 16/157,900, filed Oct. 11, 2018, entitled "Synchronous Memory Bus Access to Storage Media", which claims priority to U.S. Provisional Pat. App. Ser. No. 62/626,577, filed Feb. 5, 2018, entitled "Synchronous Memory Bus Access to Storage Media and Dram Using an SRAM Buffer," by Stonelake et al., the entire disclosures of which applications are hereby incorporated herein by reference.

FIELD OF THE TECHNOLOGY

At least some embodiments disclosed herein relate to memory systems in general, and more particularly, but not limited to synchronous memory bus access to storage media in computing systems.

BACKGROUND

A memory sub-system can be a memory module, such as a dual in-line memory module (DIMM), a small outline DIMM (SO-DIMM), or a non-volatile dual in-line memory module (NVDIMM). A memory sub-system can be a storage system, such as a solid-state drive (SSD), or a hard disk drive (HDD). A memory sub-system can include one or more memory components that store data. The memory components can be, for example, non-volatile memory components and volatile memory components. Examples of memory components include memory integrated circuits. Some memory integrated circuits are volatile and require power to maintain stored data. Some memory integrated circuits are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Examples of volatile memory include Dynamic Random-Access Memory (DRAM) and Static Random-Access Memory (SRAM). In general, a host system can utilize a memory sub-system to store data at the memory components and to retrieve data from the memory components.

For example, a computer can include a host system and one or more memory sub-systems attached to the host system. The host system can have a central processing unit (CPU) in communication with the one or more memory sub-systems to store and/or retrieve data and instructions. Instructions for a computer can include operating systems, device drivers, and application programs. An operating system manages resources in the computer and provides common services for application programs, such as memory allocation and time sharing of the resources. A device driver operates or controls a particular type of device in the computer; and the operating system uses the device driver to offer resources and/or services provided by the type of device. A central processing unit (CPU) of a computer system can run an operating system and device drivers to provide the services and/or resources to application programs. The central processing unit (CPU) can run an application program that uses the services and/or resources. For example, an application program implementing a type of application of computer systems can instruct the central processing unit (CPU) to store data in the memory components of a memory sub-system and retrieve data from the memory components.

An operating system of a computer system can allow an application program to use virtual addresses of memory to store data in, or retrieve data from, memory components of one or more memory sub-systems of the computer system. The operating system maps the virtual addresses to physical addresses of one or more memory sub-systems connected to the central processing unit (CPU) of the computer system. The operating system implements the memory accesses specified at virtual addresses using the physical addresses of the memory sub-systems.

A virtual address space can be divided into pages. A page of virtual memory can be mapped to a page of physical memory in the memory sub-systems. The operating system can use a paging technique to access a page of memory in a storage device via a page of memory in a memory module. At different time instances, the same page of memory in a memory module can be used as proxy to access different pages of memory in the storage device or another storage device in the computer system.

A computer system can include a hypervisor (or virtual machine monitor) to create or provision virtual machines. A virtual machine is a computing device that is virtually implemented using the resources and services available in the computer system. The hypervisor presents the virtual machine to an operating system as if the components of virtual machine were dedicated physical components. A guest operating system runs in the virtual machine to manage resources and services available in the virtual machine, in a way similar to the host operating system running in the computer system. The hypervisor allows multiple virtual machines to share the resources of the computer system and allows the virtual machines to operate on the computer substantially independently from each other.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
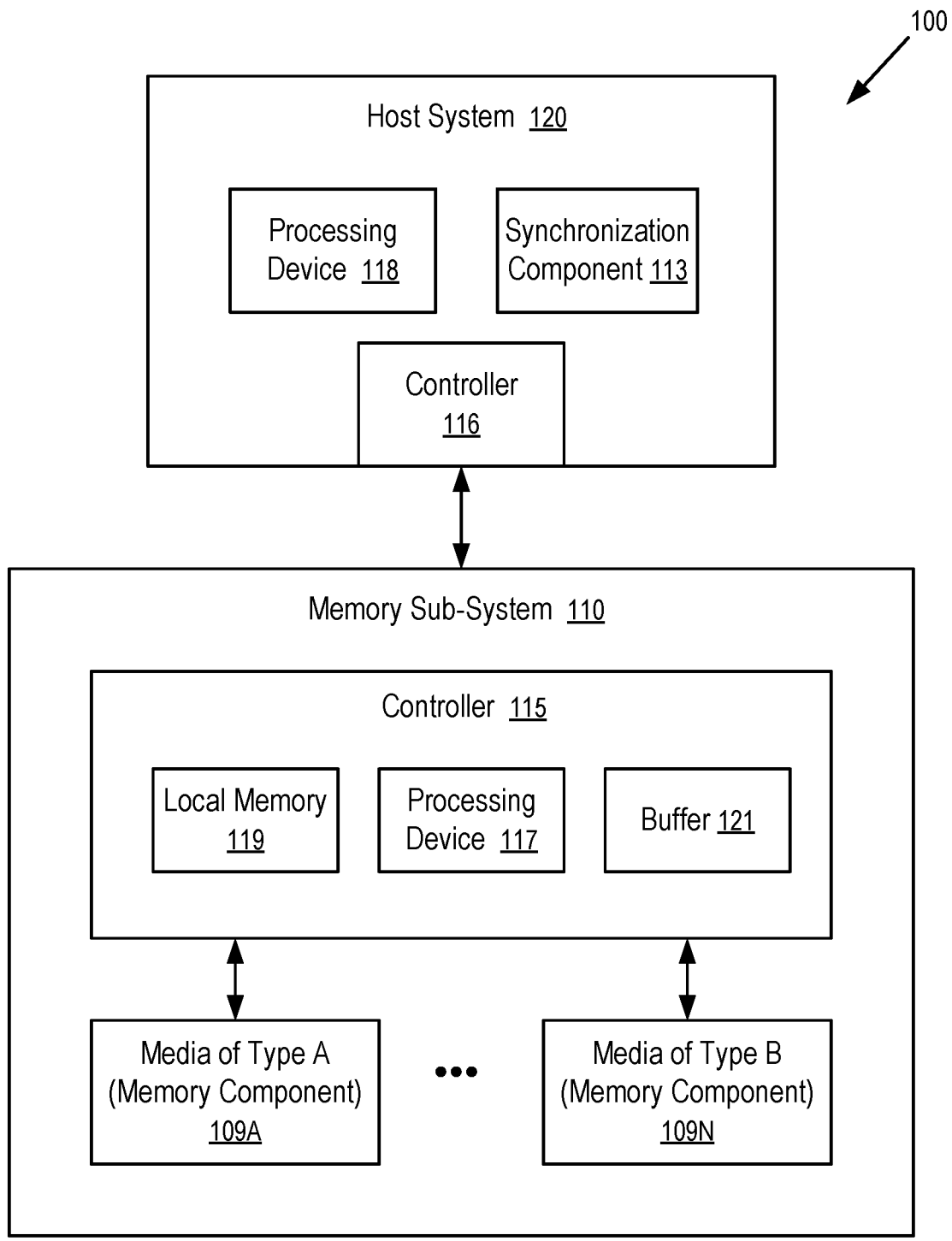
FIG. 1 illustrates an example computing system having a memory sub-system in accordance with some embodiments of the present disclosure.

At least some aspects of the present disclosure are directed to synchronous memory bus access to storage media in a computer system having one or more memory sub-systems. A memory sub-system is also hereinafter referred to as a "memory device". An example of a memory sub-system is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory sub-system is a storage device that is connected to the central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). In some embodiments, the memory sub-system is a hybrid memory/storage sub-system that provides both memory functions and storage functions. In general, a host system can utilize a memory sub-system that includes one or more memory components. The host system can provide data to be stored at the memory sub-system and can request data to be retrieved from the memory sub-system.

In a conventional system, a host can access various types of memory, including volatile and non-volatile memory. It has been recognized that non-volatile memory (e.g., cross point memory) is a memory technology that typically has a longer response time than volatile memory (e.g., DRAM). This longer response time can prevent supporting the non-volatile memory on a synchronous bus (e.g., a DDR4 bus), which can lead to longer access times for the host to access data stored in the non-volatile memory.

At least some aspects of the present disclosure address the above and other deficiencies by using a synchronization component that provides synchronous memory bus access to storage media (e.g., non-volatile memory). In various embodiments, a memory system provides host access to data stored in a non-volatile memory on, for example, a memory module (e.g., a DIMM) by using a synchronous memory bus. Data stored in the non-volatile memory (e.g., a page of data to which the host desires access) is moved in and out of a memory buffer (e.g., SRAM) of the memory module so that data stored in the non-volatile memory can be accessed using the memory bus similarly as for accessing data stored in a volatile memory (e.g., access to DRAM using a DDR4 bus). Thus, the memory access by the host can be accelerated by using the synchronous memory bus access.

In one example, the volatile memory is DRAM, and the non-volatile memory is cross-point memory (e.g., 3DXP memory). A host system accesses the DRAM over a DDR4 memory bus. For example, the buffer can be SRAM that acts as a transient buffer for data transfer between 3DXP and DRAM. The 3DXP data can move to/from the SRAM buffer, for example, at any time (independent of the state of the host DDR memory bus). The host can access paged-in 3DXP data either from the SRAM buffer, or after the data has reached the DRAM from the SRAM buffer.

More specifically, in one example, a DDR4 memory bus is a synchronous bus and requires predetermined response times for proper operation. For example, a 3D cross point memory is attached to the DDR4 bus on a DIMM behind a regular set of DRAM. A typical DIMM may have, for example, 16-32 gigabytes of DRAM memory that is accessible by a host using DDR4 synchronous timing.

Various embodiments provide access, via the DDR4 bus, to data in 3DXP memory on the DIMM by reserving one or more DRAM refresh cycles so that the host does not issue read or write commands to access the DRAM during these reserved time frames. In one embodiment, the refresh rate for the DRAM is artificially increased for the DRAM bus. This means that the host controller generates more frequent refresh commands than are actually needed to refresh the DRAM during normal operation. One or more of the reserved refresh cycles are used to move data to and from the 3D cross point memory that is sitting behind that DRAM via the DRAM controller itself that is on the DIMM.

In one embodiment, a hybrid DIMM includes both DRAM and 3DXP for operation on a DDR4 bus that requires a response time that may exceed the performance level of 3DXP, if the 3DXP were to be added in a prior conventional way. However, according to various embodiments, a memory system controller on the hybrid DIMM communicates with a host system that has been configured to request one or more extra refresh cycles. The extra refresh cycles are used by the memory system controller to transfer data between DDR4 DRAM and an SRAM buffer that is part of the DIMM so that the use of the 3DXP storage media does not require changes to the host operation in communicating on the DDR memory bus (e.g., the host can operate in a manner similarly or the same as if conventional DRAM were being accessed).

In one embodiment, transfers to/from 3DXP to a first port of a dual-ported SRAM can be scheduled any time. Only the transfers to/from the SRAM buffer and the DRAM need to be synchronized with reserved refresh cycles. A second port of the dual-ported SRAM is exposed to the host as part of the DDR address space and can be accessed any time that refresh is not active on the SRAM portion of the DDR address space.

In one example, a BIOS for the host is configured to cause the host operating system (OS) to set refresh timing (e.g., via configuring tREFI/tRFC parameters) at the time of the host booting up. When the OS uses these customized tREFI/tRFC parameters, the memory system controller can match the timing for accessing 3DXP (via the SRAM buffer) and the timing for accessing the DRAM.

In one embodiment, the memory system controller can expose SRAM within a portion of the DRAM address space or as an extension of the DRAM address space, if the SRAM matches the full timing requirements of the DRAM (and not only tREFI/tRFC). To expose the SRAM within the DRAM address space, the memory system controller decodes ACTIVATE commands and passes them through to DRAM rows that are not to be intercepted. Otherwise, the memory system controller will capture those ACTIVATE commands and respond to following READ/WRITE commands that target the activated bank and row with read/write from/to the SRAM.

To expose the SRAM as an extension of DRAM space, the memory system controller decodes CS or CiD signals, and responds to all DRAM commands on a dedicated CS/CiD (rank) from the SRAM. The SRAM address space is smaller than a DRAM, so larger addresses on that CS/CiD (rank) are aliased into SRAM address space. System software is made aware and only uses the portion of the additional CS/CiD (rank) that matches the SRAM size.

In one embodiment, when the system is configured with customized tREFI/tRFC parameters, the memory system controller can additionally use the additional refresh cycles to synchronize transfers between SRAM and DRAM. This is accomplished by the memory system controller intercepting the REFRESH command and deciding if the REFRESH command should be forwarded to the DRAM, based on a counter. If the REFRESH command is not to be forwarded to the DRAM, the REFRESH command can either be replaced with an NOP command or DRAM CS can be squelched, such that the DRAM does not execute the REFRESH command. In that same REFRESH cycle, memory system controller is free to issue commands to the DRAM to implement transfers to/from SRAM.

In addition, the memory system controller can maintain a mapping table of DDR pages mapped to the SRAM buffer in order to speed up data access in cases for which the data is already in the SRAM buffer. In one embodiment, the memory system controller decodes a DDR ACTIVATE command, and the controller uses a lookup table or CAM to determine whether the target bank and row have been re-mapped to the SRAM, or should be passed through to the DRAM. The mapping table in the memory system controller supports transparent re-mapping of pages (from the host system and host memory controller perspective). Thus, after a 3DXP page has been copied from SRAM to DRAM, the mapping table can be updated such that the access is redirected from SRAM to DRAM. As long as the entire DRAM page has been transferred during the reserved REFRESH cycle, the host is not aware that data has moved from SRAM to DRAM.

FIG. 1 illustrates an example computing system 100 having a memory sub-system 110 in accordance with some embodiments of the present disclosure. The memory sub-system 110 can include media, such as memory components 109A to 109N. The memory components 109A to 109N can be volatile memory components, non-volatile memory components, or a combination of such. In some embodiments, the memory sub-system 110 is a memory module. Examples of a memory module include a DIMM and an NVDIMM. In some embodiments, the memory sub-system is a storage system. An example of a storage system is an SSD. In some embodiments, the memory sub-system 110 is a hybrid memory/storage sub-system. In general, the computing environment can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, etc. The physical host interface can be used to transmit data between the host system 120 and the memory sub-system 110. The host system 120 can further utilize an NVM Express (NVMe) interface to access the memory components 109A to 109N when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The host system 120 includes a processing device 118 and a controller 116. The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110.

In general, the controller 116 can send commands or requests to the memory sub-system 110 for desired access to memory components 109A to 109N. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory components 109A to 109N and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory components 109A to 109N can include any combination of the different types of non-volatile memory components and/or volatile memory components. An example of non-volatile memory components includes a negative-and (NAND) type flash memory. Each of the memory components 109A to 109N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 109A to 109N can be based on any other type of memory such as a volatile memory. In some embodiments, the memory components 109A to 109N can be, but are not limited to, random access memory (RAM), read-only memory (ROM), dynamic random access memory (DRAM), synchronous dynamic random access memory (SDRAM), phase change memory (PCM), magneto random access memory (MRAM), Spin Transfer Torque (STT)-MRAM, ferroelectric random-access memory (FeTRAM), ferroelectric RAM (FeRAM), conductive bridging RAM (CBRAM), resistive random access memory (RRAM), oxide based RRAM (OxRAM), negative-or (NOR) flash memory, electrically erasable programmable read-only memory (EEPROM), nanowire-based non-volatile memory, memory that incorporates memristor technology, and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 109A to 109N can be grouped as memory pages or data blocks that can refer to a unit of the memory component used to store data.

The controller 115 of the memory sub-system 110 can communicate with the memory components 109A to 109N to perform operations such as reading data, writing data, or erasing data at the memory components 109A to 109N and other such operations (e.g., in response to commands scheduled on a command bus by controller 116). The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processing device 117 (processor) configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 109A to 109N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 109A to 109N. The controller 115 can further include host interface circuitry to communicate with the host system 120 via the physical host interface. The host interface circuitry can convert the commands received from the host system into command instructions to access the memory components 109A to 109N as well as convert responses associated with the memory components 109A to 109N into information for the host system 120.

The memory sub-system 110 can also include additional circuitry or components that are not illustrated. In some embodiments, the memory sub-system 110 can include a cache or buffer (e.g., DRAM or SRAM) and address circuitry (e.g., a row decoder and a column decoder) that can receive an address from the controller 115 and decode the address to access the memory components 109A to 109N.

The computing system 100 includes a synchronization component 113 in the host system 120 that works in conjunction with a buffer 121 to provide synchronous memory bus access to storage media in memory sub-system 110. In one example, the buffer 121 is SRAM. The memory sub-system 110 can provide access for host system 120 to data in a storage media (e.g., 3DXP memory) via a DDR or other type of synchronous memory bus. In one embodiment, the access is provided to data in 3DXP memory on a DIMM by reserving one or more DRAM refresh cycles so that the host system 120 does not issue read or write commands to access the DRAM during the reserved cycles. One or more of the reserved refresh cycles are used to move data between buffer 121 and DRAM memory on the DIMM. In contrast, 3DXP memory to buffer 121 transfers do not need to be synchronized with reserved refresh cycles. The moved data is then made accessible in a DRAM memory address space of the host system 120 for access during normal host read/write requests made over the DDR memory bus.

In one example, host system 120 sends a page-in request (for access to a page) to controller 115. In response to receiving the page-in request, controller 115 moves a page from a slow media such as non-volatile memory to volatile memory (e.g., DRAM on memory sub-system 110).

In one example, host system 120 sends a page-out request to controller 115. In response to receiving the page-out request, controller 115 moves data out of volatile memory (e.g., the DRAM on memory sub-system 110) to non-volatile memory via buffer 121. The data is moved out of the volatile memory to buffer 121 during one or more refresh cycles that have been reserved for this purpose. The data is then moved from buffer 121 to the non-volatile memory (e.g., 3DXP). In one embodiment, there is no particular timing requirement for the data movement from buffer 121 (e.g., SRAM) to the 3DXP memory.

It has been recognized, for example, that data movement between DRAM and the SRAM buffer (e.g., for page-in and page-out requests) is limited by DDR bus signals from the host system 120 to memory sub-system 110 (e.g., a DIMM). It has also been recognized that use of a buffer to capture DDR signals from the host system 120 can slow down performance when the host system is accessing the DRAM in the DIMM. Also, the use of a buffer to capture DDR signals from the host system 120 can increase the cost and complexity of the interface circuitry (e.g., using a DDR slot). Various embodiments herein overcome these deficiencies by using memory bus synchronization via synchronization component 113 and buffer 121.

In some embodiments, the controller 116 and/or the processing device 118 in the host system 120 includes at least a portion of the synchronization component 113. For example, the controller 116 and/or the processing device 118 can include logic circuitry implementing the synchronization component 113. For example, the processing device 118 (processor) of the host system 120 can be configured to execute instructions stored in memory for performing operations that control memory bus timing for the synchronization component 113 as described herein. In some embodiments, the synchronization component 113 is part of an operating system of the host system 120, a device driver, or an application.

In one example, a central processing unit (CPU) can access memory in a memory system connected to the CPU. For example, the central processing unit (CPU) can be configured to access the memory using synchronization component 113. For example, a non-volatile memory can not be directly addressable by the CPU and is coupled to a volatile memory that is directly addressable by the CPU. The non-volatile memory is accessed via the volatile memory swapping data to and from buffer 121 and controlling memory access using synchronization component 113.

Figure 2:
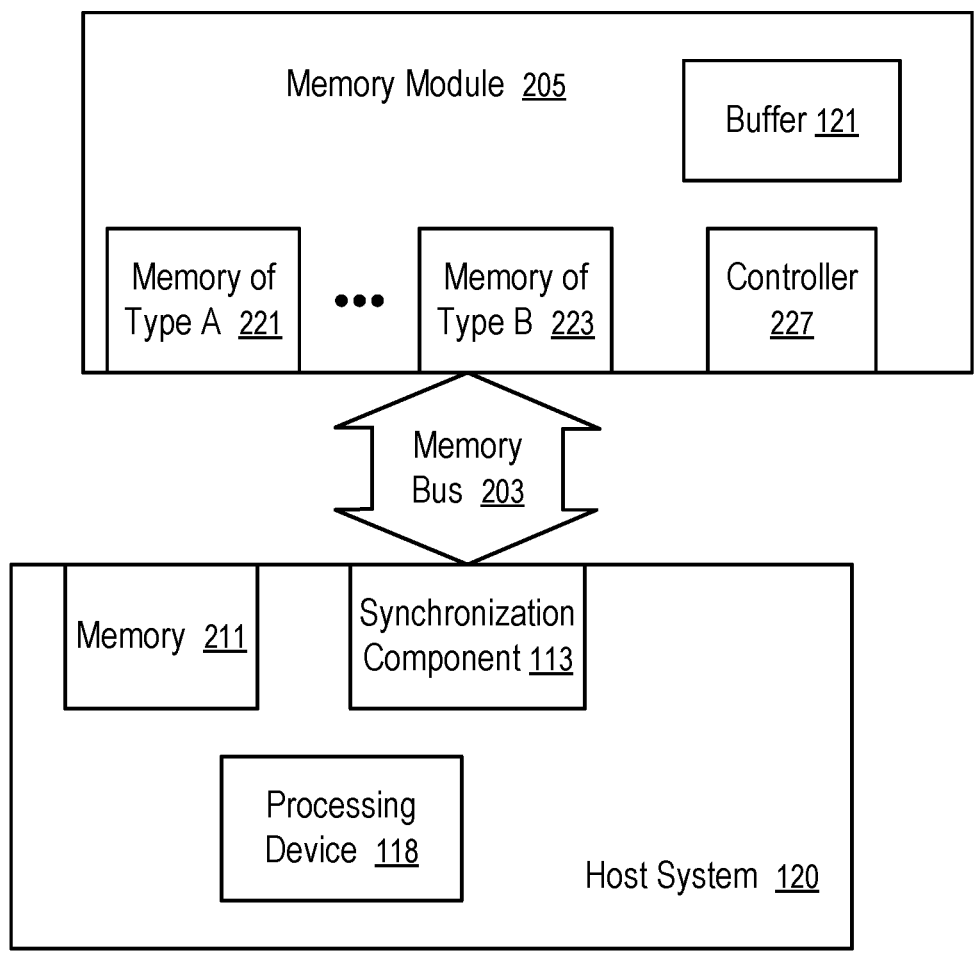
FIG. 2 shows a computing system having different types of memory and running instructions for synchronous memory bus access to storage media in accordance with some embodiments of the present disclosure.

FIG. 2 shows a computing system having different types of memory. The computing system is executing instructions for synchronous memory bus access to storage media in accordance with some embodiments of the present disclosure. The computing system of FIG. 2 includes a host system 120, and a memory module 205 connected to the host system 120 via a memory bus 203. The memory module 205 is an example of the memory sub-system 110 illustrated in FIG. 1.

The host system 120 has a processing device 118, which can be a central processing unit or a microprocessor with one or more processing cores. The host system 120 can have a cache memory 211. At least a portion of the cache memory 211 can be optionally integrated within the same integrated circuit package of the processing device 118.

The memory module 205 illustrated in FIG. 2 has multiple types of memory (e.g., 221 and 223). For example, memory of type A 221 (e.g., DRAM) is faster than memory of type B 223 (e.g., 3DXP). For example, the memory bus 203 can be a double data rate bus. In general, several memory modules (e.g., 205) can be coupled to the memory bus 203.

The processing device 118 is configured via instructions (e.g., an operating system and/or one or more device drivers) to access a portion of memory in the computer system via another portion of memory in the computer system using synchronization component 113. For example, memory of type B 223 (e.g., 3DXP) of the memory module 205 can be accessed via memory of type A 221 (e.g., DRAM) of the memory module 205. For example, memory of type B 223 of the memory module 205 is accessible only through addressing the memory of type A 221 of the memory module 205.

A controller 227 can be provided in the memory module 205 to manage data transfer between the memory of type A 221 and the memory of type B 223 within the memory module 205. In one embodiment, controller 227 multiplexes access to DRAM by both host system 120 and memory module 205 when transferring data to or from buffer 121. In one example, memory bus 203 provides a host DDR channel as the DDR interface between host system 120 and memory module 205.

In one example, once a page is retrieved from 3DXP memory into buffer 121, the page can be loaded into DRAM for access by the host via a conventional DDR4 slot (e.g., the host DDR channel). To swap a page out of the DRAM, data moves from the DRAM to buffer 121, and then to 3DXP memory.

In general, the memory sub-systems (e.g., 205) can include media, such as memory (e.g., 221, . . . , 223). The memory (e.g., 221, . . . , 223) can include volatile memory, non-volatile memory (NVM), and/or a combination of such. In some embodiments, the computer system includes at least one memory sub-system that is a storage device (not shown). An example of a storage device is a solid-state drive (SSD). In some embodiments, the computer system includes at least one memory sub-system that is a hybrid memory/storage system configured as a memory module 205. The processing device 118 can write data to each of the memory sub-systems (e.g., 205) and read data from the memory sub-systems (e.g., 205) directly or indirectly.

In one embodiment, memory module 205 provides synchronous memory bus access to non-volatile storage media via volatile memory by using buffer 121. In one example, memory module 205 is a DIMM coupled to a host system 120 via a DDR bus. The storage media is, for example, cross-point memory (e.g., 3DXP). Portions of data stored in storage media are swapped in and out of DRAM (via an SRAM buffer) using reserved refresh cycles, as described below. The transfers between the storage media and the SRAM buffer can occur any time (e.g., a dual-ported SRAM is used).

In one embodiment, the host communicates with the memory module via a communication channel for read/write operations (e.g., using a DDR4 bus). The host can be a server or other computer having one or more Central Processing Units (CPUs) to which computer peripheral devices, such as the memory module, may be attached via an interconnect, such as a computer bus (e.g., Peripheral Component Interconnect (PCI), PCI eXtended (PCI-X), PCI Express (PCIe)), a communication portion, and/or a computer network.

In one embodiment, the memory module can be used to store data for the host in the non-volatile storage media, but with access via a synchronous DRAM memory interface, as described herein. The memory module has a host interface that implements communications with the host using the communication channel.

In one embodiment, the memory module 205 has the controller 227 running, for example, firmware to perform operations responsive to communications from the host. These operations include movement of pages of data to and from the storage media in anticipation of upcoming needs by software executing on the host. The firmware controls the operations of the controller 227 in operating the memory module, such as swapping of data in and out of the buffer 121 during reserved refresh cycles, as discussed in more detail below.

In one embodiment, as mentioned above, the non-volatile storage media is cross point memory. In other embodiments, the storage media can use a different type of memory (e.g., different type of storage class memory). For example, memory cells in a storage media may be implemented using various memory/storage technologies, such as NAND gate based flash memory, phase-change memory (PCM), and resistive random-access memory, such that the storage media is non-volatile.

The memory module includes volatile Dynamic Random-Access Memory (DRAM). The DRAM stores data accessible by the host in a DRAM memory address space. In one example, cross point storage and memory devices (e.g., 3DXP memory) have data access performance that can be made comparable to DRAM according to various embodiments.

The computing system of FIG. 2 can be used to implement a desktop computer, laptop computer, network server, mobile device, or such computing device that includes a memory and a processing device. The processing device 118 can read data from or write data to the memory sub-systems (e.g., 205).

The processing device 118 can be coupled to a memory sub-system (e.g., 205) via one or more physical interfaces (e.g., 203). As used herein, "coupled to" generally refers to a connection between components, which can be an indirect communicative connection or direct communicative connection (e.g., without intervening components), whether wired or wireless, including connections such as, electrical, optical, magnetic, etc.

The physical host interface can be used to transmit data between the processing device 118 and the memory sub-system (e.g., 205). The physical host interface can provide an interface for passing control, address, data, and other signals between the memory sub-system (e.g., 205) and the processing device 118.

In general, a memory sub-system (e.g., 205) includes a printed circuit board that connects a set of memory devices, such as memory integrated circuits, that provides the memory (e.g., 221, . . . , 223). The memory (e.g., 221, . . . , 223) on the memory sub-system (e.g., 205) can include any combination of the different types of non-volatile memory devices and/or volatile memory devices.

An example of non-volatile memory devices includes a negative-and (NAND) type flash memory or a negative-or (NOR) type flash memory. A memory integrated circuit can include one or more arrays of memory cells, such as single level cells (SLCs), multi-level cells (MLCs), triple level cells (TLCs), quad-level cells (QLCs), etc. In some implementations, a particular memory device can include both an SLC portion and a MLC (or TLC or QLC) portion of memory cells. Each of the memory cells can store one or more bits of data used by the host system 120. Although non-volatile memory devices such as NAND type flash memory are described, the memory integrated circuits can be based on any other type of memory such as a volatile memory. In some implementations, the memory (e.g., 221, . . . , 223) can include, but are not limited to, random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), and/or a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices can be grouped as memory pages or data blocks that can refer to a unit of the memory device used to store data.

A memory sub-system (e.g., 205) can have a controller (e.g., 227) that communicates with the memory (e.g., 221, . . . , 223) to perform operations such as reading data, writing data, or erasing data in the memory (e.g., 221, . . . , 223) and other such operations, in response to requests, commands or instructions from the processing device 118. The controller (e.g., 227) can include hardware such as one or more integrated circuits and/or discrete components, a buffer memory, or a combination thereof. The controller (e.g., 227) can be a microcontroller, special purpose logic circuitry (e.g., a field programmable gate array (FPGA), an application specific integrated circuit (ASIC), etc.), or another suitable processor. The controller (e.g., 227) can include one or more processors (processing devices) configured to execute instructions stored in local memory.

The local memory of the controller (e.g., 227) can include an embedded memory configured to store instructions for performing various processes, operations, logic flows, and routines that control operation of the memory sub-system (e.g., 205), including handling communications between the memory sub-system (e.g., 205) and the processing device 118, and other functions described in greater detail below. Local memory of the controller (e.g., 227) can include read-only memory (ROM) for storing micro-code and/or memory registers storing, e.g., memory pointers, fetched data, etc.

While the example memory sub-system 205 in FIG. 2 has been illustrated as including controller 227, in another embodiment of the present disclosure, a memory sub-system (e.g., 205) may not include a controller (e.g., 227), and can instead rely upon external control (e.g., provided by a processor or controller separate from the memory sub-system (e.g., 205)).

In general, the controller (e.g., 227) can receive commands, requests or instructions from the processing device 118 in accordance with a standard communication protocol for the communication channel (e.g., 203) and can convert the commands, requests or instructions in compliance with the standard protocol into detailed instructions or appropriate commands within the memory sub-system (e.g., 205) to achieve the desired access to the memory (e.g., 221, . . . , 223). For example, the controller (e.g., 227) can be responsible for operations such as wear leveling operations, garbage collection operations, error detection and error-correcting code (ECC) operations, encryption operations, caching operations, and address translations between a logical block address and a physical block address that are associated with the memory (e.g., 221, . . . , 223). The controller (e.g., 227) can further include host interface circuitry to communicate with the processing device 118 via the physical host interface. The host interface circuitry can convert the commands received from the processing device 118 into command instructions to access the memory devices (e.g., 221, . . . , 223) as well as convert responses associated with the memory devices (e.g., 221, . . . , 223) into information for the processing device 118.

The memory sub-system (e.g., 205) can also include additional circuitry or components that are not illustrated. In some implementations, the memory sub-system (e.g., 205) can include a cache or buffer (e.g., DRAM) and address circuitry (e.g., a row decoder and a column decoder) that can receive an address from the controller (e.g., 227) and decode the address to access the memory (e.g., 221, . . . , 223).

In one example, the memory bus 203 has one or more connectors to provide the memory sub-system (e.g., 205) with power and/or communicate with the memory sub-system (e.g., 205) via a predetermined protocol; and the memory sub-system (e.g., 205) has one or more connectors to receive the power, data and commands from the processing device 118.

In general, the processing device 118 can execute one or more operating systems to provide services, including memory access in which a portion of memory (e.g., a page stored in 3DXP) in the computer system is accessed via another portion of memory (e.g., DRAM) in the computer system using synchronous memory access, as further discussed below.

Figure 3:
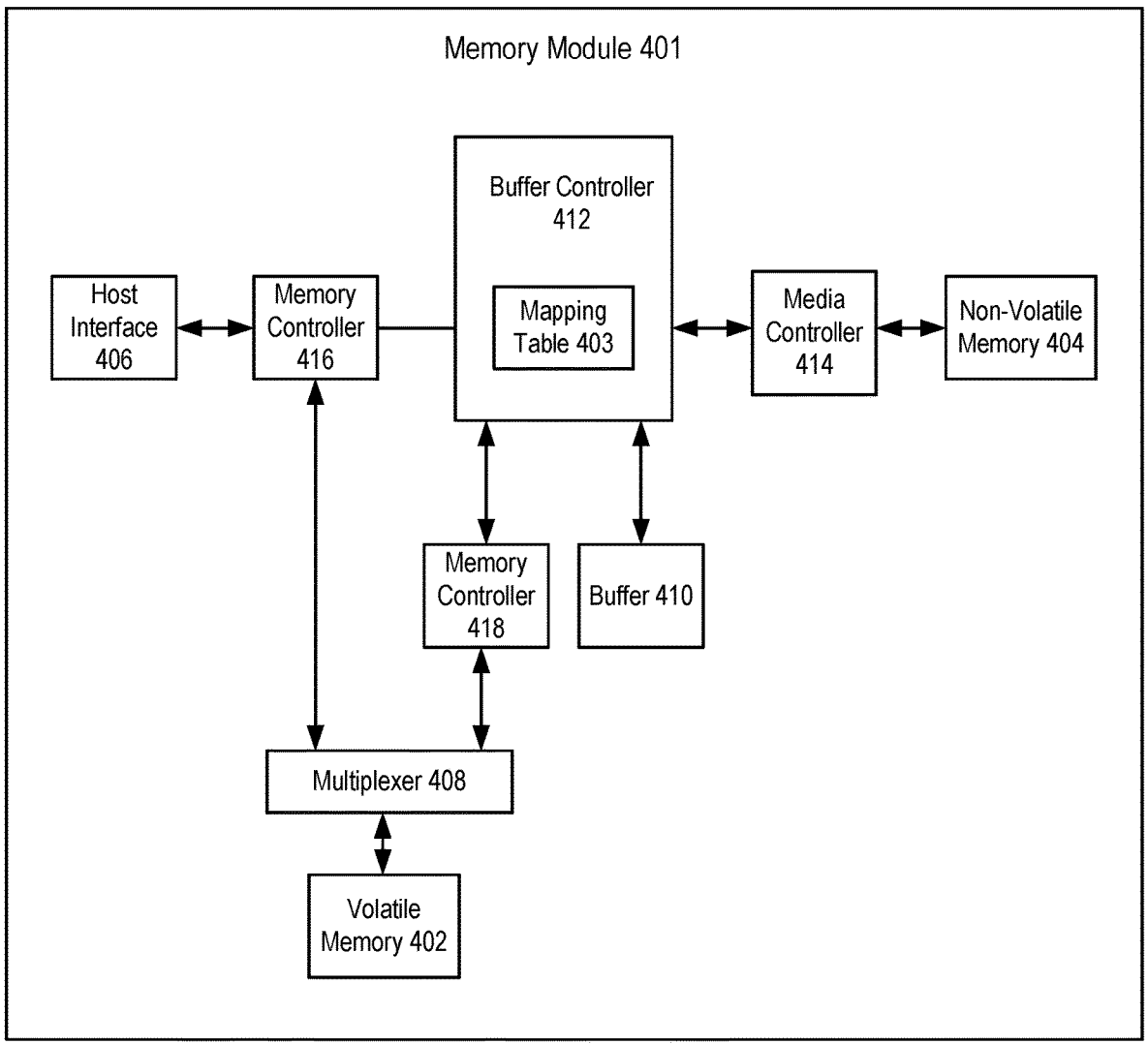
FIG. 3 shows a memory module configured for synchronous memory bus access by a host system to a non-volatile memory of the memory module in accordance with some embodiments of the present disclosure.

FIG. 3 shows a memory module 401 configured for synchronous memory bus access by a host system (e.g., host system 120) to a non-volatile memory 404 (e.g., 3DXP) of the memory module 401 in accordance with some embodiments of the present disclosure. Memory module 401 is an example of memory sub-system 110 or memory module 205. In one example, memory module 401 is a hybrid DIMM.

Memory module 401 includes volatile memory 402 (e.g., DRAM), buffer 410 (e.g., SRAM), and a media controller 414 for accessing the non-volatile memory 404. Memory module 401 also includes a buffer controller 412 to control the moving of data between non-volatile memory 404 and buffer 410, and between buffer 410 and volatile memory 402 (e.g., in response to page-in or page-out requests). Buffer 410 is an example of buffer 121.

Memory module 401 uses multiplexer 408 to provide access to volatile memory 402 by both memory controller 416 and memory controller 418. In one embodiment, multiplexer 408 is controlled by buffer controller 412 (e.g., based on signals received from memory controller 416 as read or write commands received from the host system 120 via host interface 406).

Memory controller 416 is coupled to host interface 406 for handling read/write access by a host system. Memory controller 418 is coupled to buffer controller 412 for handling read/write access by buffer controller 412 when moving data to or from buffer 410.

In one embodiment, buffer controller 412 maintains a mapping table 403. In one example, the mapping table 403 includes a list of pages mapped to buffer 410. In one example, buffer controller 412 uses mapping table 403 to determine whether to service a read or write command from the host system using volatile memory 402 or buffer 410.

In one example, volatile memory 402 is DRAM that can be accessed by the host system via host interface 406 (e.g., a DDR4 slot), and also accessed by the buffer controller 412 within the memory module 401 (e.g., a DIMM). Because the DDR4 DRAM can be operated from both sides, clocks from both the DDR4 slot and from the buffer controller 412 are synchronized.

In operation, the host system reads/writes DDR4 data through the DDR4 slot. The content in the non-volatile memory 404 (e.g., 3DXP memory) is accessed indirectly through the DDR4 slot. For example, to operate on a page in 3DXP, a page in/out control path (e.g., implemented in a control channel over memory bus 203) is used to request that the memory module 401 swap a 3DXP page into the DDR4 DRAM (or swap an existing page out of DDR4 DRAM).

In one example, in response to a page-in request, the buffer controller 412 reads the page from the 3DXP memory and moves the page into buffer 410 (e.g., SRAM). The SRAM is sufficiently fast to match the DDR4 operating cycles at the host interface 406. The timing cycles used by the buffer controller 412 to access memory controller 416 (e.g., a DDR4 slave) match with the timing cycles of the DDR4 channel on the memory bus as such timing is controlled by the host system.

When the host system is using the DDR4 channel, the buffer controller 412 does not access the DDR4 DRAM. The host system allows the DDR4 DRAM to perform its own tasks in certain refreshing cycles (e.g., tRFC). In such cycles, the buffer controller 412 can transfer data between DDR4 DRAM and buffer 410. Coordination between the host system and the memory module 401 is such that the host system issues sufficient refresh cycles so that the buffer controller 412 can use these cycles to move data between DDR4 DRAM and buffer 410 for swapping in/out the 3DXP page. For swapping out a page, the buffer controller 412 reads the data of the page from the DDR4 DRAM during the reserved refresh cycles, buffers them in the buffer 410, and then subsequently saves the page to the 3DXP memory.

In one example, a host system accesses a memory space (e.g., DRAM memory address space) on the memory module 401 (e.g., a DIMM). The DIMM exposes itself to the host as a channel of DRAM. For example, 16 GB of DRAM can operate from the host software perspective like normal DRAM until a driver is loaded in the host that implements synchronization component 113. The driver is loaded in the hypervisor of the host. For example, the driver is loaded from a hard drive of the host.

In one example, the driver uses a control path to request blocks, for example 4K byte blocks or larger, of 3DXP data, to be moved in and out of various DRAM addresses on the DIMM. The driver and hypervisor has a mapping between the DRAM addresses and the 3DXP data (see, e.g., mapping table 246 of FIG. 4 discussed below).

In one embodiment, the driver and hypervisor control data movement on the DIMM. For example, a request is made for moving 3DXP blocks in and out of the DRAM address space and exposing the DRAM pages to software running on the host. The software is, for example, executing in a virtual machine (VM). Once the mapping has been made by the driver, the host can access those pages in the DRAM similarly as would be done for conventional DRAM memory. Thus, read and write operations can be performed using the CPU of the host system so that any data within a page that is mapped can be accessed.

In one example, a page in/out control path is provided for the driver to request either a page that is currently in DRAM to be written back to the 3DXP memory, or to request a page that is currently in the 3DXP memory that is not in the DRAM to be paged in. In one example, the 3DXP memory has a much larger capacity than the DRAM (e.g., 128 GB of 3DXP memory on the DIMM). So, the software of the host system could at any one time at most access 16 GB of that capacity. The driver at the host system is controlling which 16 GB portion of the total capacity is being exposed at any one time. Typically, this can be implemented using 4K byte granularity (e.g., using 4K byte pages).

In one example, memory module 401 is implemented as a DIMM. The non-volatile memory 404 (storage media) is provided by cross point memory packages. The buffer controller 412 communicates with the cross point memory packages via media controller 414 (and also can include management of ECC for reading and writing from the cross point memory). For example, pages of data initially obtained from the cross point memory are copied in and out of buffer 410 (page in/page out). In one example, a DDR slave is attached to the host DDR bus (e.g., a DDR4 slot), and the host access requests come through a DDR controller. Volatile memory 402 is DRAM, and host read/write requests are directed to the DRAM via memory controller 416.

In one example, DDR slave cycles are reserved for SRAM transfers. For example, a normal DRAM refresh cycle at room temperature has a frequency of every 7.8 microseconds (e.g., timing for a refresh tRFC). When implementing synchronization component 113, the host system is configured to implement a faster refresh frequency than is required for actual refresh of the DRAM (e.g., the host controls refresh cycles more frequently than a normal frequency). In one example, the refresh frequency is increased by a factor of four. For one cycle out of these four refresh cycles, a synchronization is performed as controlled by the host refresh, and this triggers a refresh to occur on the internal DRAMs of memory module 401. For the other three cycles of the four refresh cycles, these are idle cycles in which the buffer controller 412 can read and write between the buffer 410 and the DRAM without knowledge of or control by the host. Thus, there is a matching of a lower speed bandwidth and a longer latency time of the cross point memory with the ability to transfer that data into a DDR interface and to make data available to a standard DDR4 host (e.g., host system 120).

In one example, the host system has read/write access to any DRAM address using normal DDR4 timing. For example, the host can generate arbitrary traffic per DDR4 roles during those times.

In one embodiment, regarding read/write access to the DRAM by the buffer 410, the reserved refresh cycles provide time windows when 3DXP data can be pushed to and from the DRAM. The buffer controller 412 can read and write the 3DXP memory and have the data staged in the buffer 410 at any time (buffer 410 is a staging buffer for reads and writes to and from the 3DXP memory). During the refresh time periods (e.g., tRFC) that are reserved for use by buffer controller 412, that staged data can be pushed from the buffer 410 to the DRAM (without the knowledge of the host). In one example, during a tRFC cycle, a new page from the cross point memory is read into a DRAM address. The page is now available for the host to read and write in a next host read/write cycle.

In one example, the buffer 410 is used as a speed-matching buffer so that the host can receive data (that was stored in the 3DXP memory) during the regular host cycles (e.g., tREFI). This result is achieved by pushing the data to the internal DRAM from the buffer 410, as was described above.

In one example, a DDR4 slave of memory controller 416 is interfaced with buffer controller 412 to implement the use of buffer 410 (e.g., SRAM). The DDR4 slave can receive a command address and data. For example, high performance IOs are used that can run at DDR 2667 (ZQ calibration can be included). In one embodiment, the buffer controller 412 performs snooping to understand the data traffic from the host DDR channel.

In one example, DRAM master physical interfaces (PHYs) are connected to DRAMs of the memory module 401. As controlled by buffer controller 412, multiplexer 408 directs traffic either from the host to certain DRAM channels for volatile memory 402, or as needed internally in the memory module 401 (during tRFCs that are reserved for SRAM buffer read and write so that the host is not issuing read/write commands to the DRAM at this time). In one example, buffer controller 412 reads and writes from the SRAM buffer 410. Buffer controller 412 detects when the tRFC window is available for internal use by memory module 401.

In one example, the full DDR address space of the 3DXP non-volatile memory 404 is exposed to the host system. According to various embodiments, a controller (e.g., controller 116) of host system 120 can operate in the same way (e.g., same read/write and refresh timing cycles) as it would for access to a conventional DRAM. The setting of, for example, tREFI and tRFC counters is changed at the host system so that some refresh cycles can be reserved for use by buffer controller 412. For example, these changes are typically programmed in during initialization of the host controller. In one embodiment, software on the host does not need visibility to these settings (e.g., the software and host are able to operate in a normal manner).

In one embodiment, control registers are provided in the memory module 401. The control registers can sit, for example, in a reserved high part of the DDR address space (these control registers are for use by the memory module and have a predefined meaning to the memory module). The driver in the host has the ability to make a page in request, and to know when a particular page has been loaded from the 3DXP memory. If the driver does not load the page, the operation is performed as a normal DRAM operation.

Figure 4:
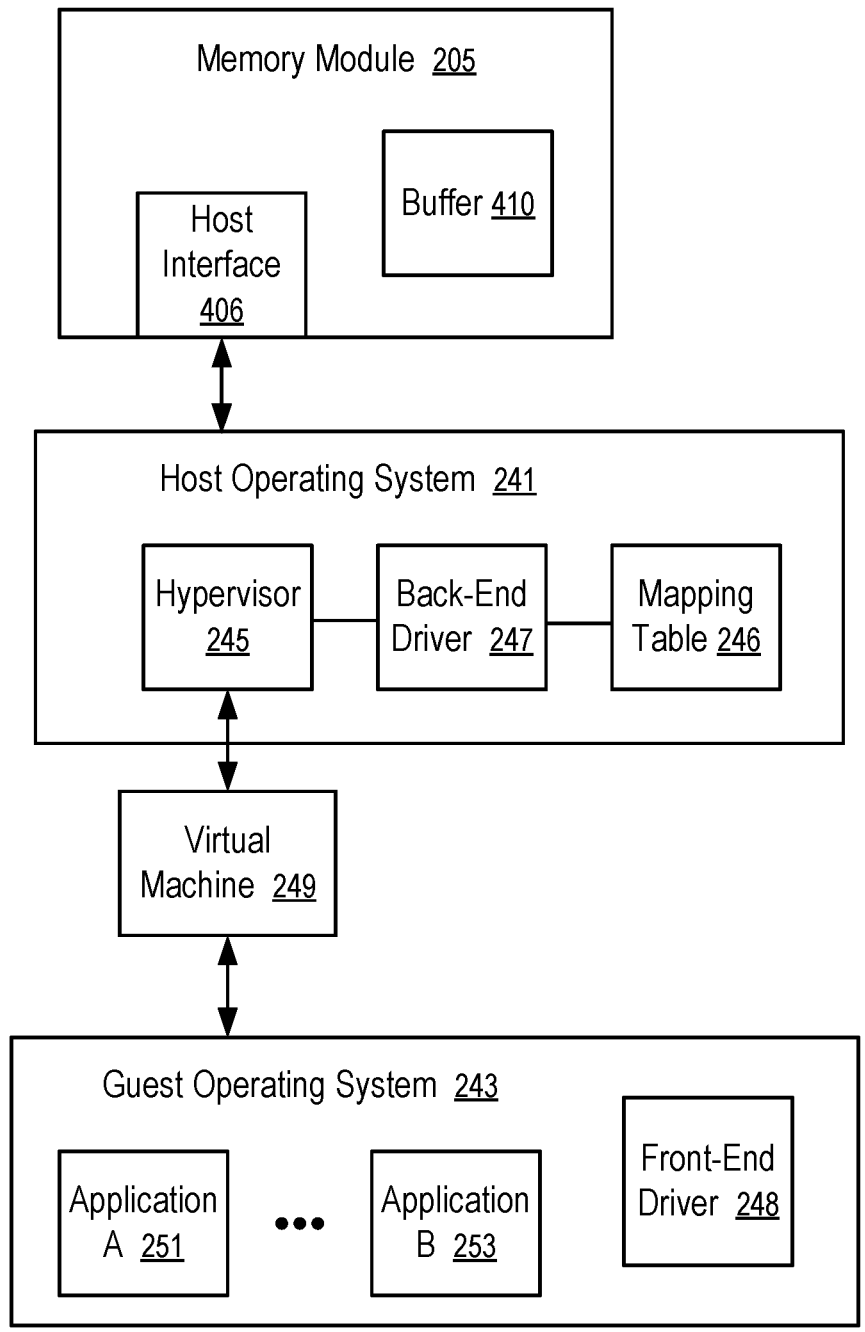
FIG. 4 shows a host operating system accessing a memory module using synchronous memory bus access in accordance with at least some embodiments of the present disclosure.

FIG. 4 shows a host operating system 241 accessing memory module 205 using synchronous memory bus access in accordance with at least some embodiments of the present disclosure. Memory module 205 includes buffer 410. Buffer 410 is an example of buffer 121. Commands and data are received from a host operating system 241 via host interface 406. In one example, host operating system 241 executes on host system 120.

In one embodiment, a device driver 247 (e.g., a back-end driver) is configured for memory access via a hypervisor 245. For example, the system of FIG. 4 can be implemented in a computer system of FIG. 1 or 2.

In one example, the host operating system 241 runs on the processing device 118 of the computer system of FIG. 1 or 2. The host operating system 241 includes one or more device drivers (e.g., 247) that provide memory services using the memory (e.g., 221, . . . , 223) of memory sub-systems, such as the memory module 205.

Back-end driver 247 maintains a mapping table 246. For example, the driver 247 maintains mapping table 246 to include a mapping for pages of data stored in non-volatile memory 404.

The host operating system 241 includes a hypervisor 245 that provisions a virtual machine 249. The virtual machine 249 has virtual hardware implemented via the resources and services provided by the host operating system 241 using the hardware of the computing system of FIG. 1 or 2. For example, the hypervisor 245 can provision virtual memory as part of the virtual machine 249 using a portion of the memory (e.g., 221, . . . , 223) of memory sub-systems, such as the memory module 205.

The virtual machine 249 allows a guest operating system 243 to provide resources and/or services to applications (e.g., 251, . . . , 253) running in the guest operating system 243, in a way as the operating system 243 running on a physical computing machine that has the same or similar set of hardware as provisioning in the virtual machine. The hypervisor 245 manages the mapping between the virtual hardware provisioned in the virtual machine and the services of hardware in the computing system managed by the host operating system 241.

A device driver 248 (e.g., a front-end driver) communicates with back-end driver 247. Driver 247 and driver 248 can communicate for memory ballooning when additional DDR capacity is available.

FIG. 4 illustrates an instance in which a virtual machine 249 is provisioned by the hypervisor 245. In general, the hypervisor 245 can provision several virtual machines (e.g., 249) that can run the same guest operating system 243, or different guest operating systems. Different sets of users and/or application programs can be assigned to use different virtual machines.

In some instances, the host operating system 241 is specialized to provide services for the provisioning of virtual machines and does not run other application programs. Alternatively, the host operating system 241 can provide additional services to support other application programs, such as applications (e.g., 251, . . . , 253).

In one embodiment, the device driver 247 can be configured to request page-in of a page from slower memory (e.g., 3DXP) to faster memory (e.g., DRAM) for use by the virtual machine 249. After requesting the page, the page is made available in the faster memory by loading and/or transferring the page of data from the slower memory to the faster memory. For example, the slower memory can be the non-volatile memory 404 in the memory module 401 and the faster memory be the volatile memory 402 in the same memory module 401.

In one embodiment, the transfer of data (e.g., performed in response to a page-in request by the host operating system 241) is performed within a same memory sub-system, such as within the same memory module 401, to avoid or reduce congestion in communication channels connected to the processing device 118, such as the memory bus 203. For example, data can be copied from the slower memory 223 (e.g., 3DXP) in the memory module 205 to the faster memory 221 (e.g., DRAM) in the memory module 205, under the control of controller 227 in the memory module 205 in response to one or more commands, requests, and/or instructions from the device driver 247.

In one embodiment, the hypervisor 245 not only requests the device driver 247 to access a memory (e.g., 221, . . . , 223) in a memory sub-system (e.g., memory module 205), but also provides the device driver 247 with information that can be used in managing pages in the memory (e.g., 221, . . . , 223) to be used.

In one example, driver 247 is a memory mode driver used to access a memory address space in memory module 205 (e.g., a DIMM). Driver 247 has control over which pages are in volatile memory of the DIMM at any one time. In one approach, for example, the memory address space is exposed to the guest operating system 243. In this hypervisor environment, the guest operating system 243 sees the full storage capacity of the non-volatile memory (e.g., 3DXP) in the DIMM.

In one example, only a number of pages that are in the DDR DRAM are actively paged in via the host operating system 241. If there is a guest access to a page that is not present, a page fault path in a memory management unit (MMU) of the host system triggers the driver 247 to cause loading (page in) of a page. In one example, the page gets loaded in through control registers. Once the page is actually present in the DDR DRAM, then the driver 247 can set up MMU mapping (via mapping table 246) so that a guest application can directly read and write that data.

In one example, a front-end driver of a guest and a back-end driver of a host communicate regarding access to the memory address space. In one example, when deciding that pages are stale (e.g., not being used frequently based on a predetermined threshold), a request is made that a portion of data that is currently mapped in the DDR memory address space be pushed back out to the 3DXP memory (e.g., via the SRAM buffer) to make space available in the DDR memory for other pages to be paged in. The back-end driver 247 communicates the page out request to move data from the DDR DRAM to the 3DXP memory.

In one embodiment, back-end driver 247 operates as a memory mode driver. Until driver 247 loads, there is no access to the 3DXP memory capacity of memory module 205. During this operation as a memory mode driver, the guest operating system 243 sees the memory as normal, and the driver 247 reserves DRAM pages on the memory module for page-in and page-out operations.

The driver 247 exposes the 3DXP memory to the guest operating system 243 and maintains the page mapping (e.g., in mapping table 246). For example, the driver 247 maintains the mapping between pages that are currently in the DRAM and pages that remain on the 3DXP memory.

In one example, the driver 247 sets up memory management unit mapping tables at the host system to map any pages that are currently stored in DRAM. A page fault path from the guest can be used if there is an access outside of a mapped page to trigger a page-in request. A page-out request can be performed to maintain some memory space in the DRAM.

In one embodiment, operation is not restricted to memory mode. Driver 247 can also be operated as a block mode driver for which the 3DXP memory is exposed as block mode storage.

In one example, a BIOS of the host system is configured to support setting of the tRFC and tREFI timing for reservation of cycles as mentioned above. The memory module 205 itself is initialized normally either from power-on or from self-refresh. In one example, certain pages are first allocated, if driver-based zeroing is done. In another example, pages that are first read are zeroed. In one example, the first time a page is requested, it is treated as a zeroed page.

In one embodiment, driver 247 generates a request to perform a page-in. In this embodiment, there can be two modes of operation. In a first mode, if the page-in request occurs in a short time period, the driver 247 can wait (e.g., a short time period can be less than 500 nanoseconds). After the operation is completed, control can be returned immediately to the guest. In one example, when in that time period, the driver can give the CPU control and run it on a thread.

In one embodiment, the driver maintains one or more mapping tables (e.g., mapping table 246). On a page-in request, there is a set of page table entries that list all of the mapped pages. At the memory module, on the DDR slave there is an option to read in the page-in request, in which data is initially transferred from 3DXP memory to the SRAM buffer. In typical operation, the buffer controller 412 waits for the appropriate window to write the data to the DRAM memory.

In one embodiment, the memory module 205 maintains its own mapping table (e.g., mapping table 403) including a list of pages that are in the SRAM buffer 410. Thus, the buffer controller 412 can service read requests for certain pages directly from the SRAM buffer 410 for pages that have completed transfer into the SRAM buffer 410 prior to the memory module 205 receiving the request. This allows shortening of the amount of time it takes for the page-in request to complete. The memory module 205 can return a page-in completion signal to the host system once the page is sitting in the SRAM buffer 410 (and the buffer controller 412 can service requests internally from the SRAM buffer 410). This permits reducing the latency for the host system to access that particular 3DXP page(s). The driver 247 ensures that until its mapping is set up, the host will not access that page(s) until the page-in request completes.

In one embodiment, driver 247 implements a page out operation. In one example, this operation is triggered as a thread. This operation trades free pages back out of the DRAM memory and changes the driver level mapping of valid pages. Flushing of the CPU cache at the host system 120 is done to ensure that any write operations are pushed into the DDR channel. Then, the page-out request can be sent to the memory module 205.

In one embodiment, in response to a page out request, if the requested page is in buffer 410, then the request can be scheduled to move the page data to non-volatile memory 404 immediately. If the requested page is in volatile memory 402, then the request is scheduled in the next available refresh window. Space is allocated in the buffer 410 for the requested page. The page is copied from volatile memory 402 to the buffer 410 during the next available refresh window. Then, a write can be scheduled from the buffer 410 to non-volatile memory 404 at any subsequent time. The host system does not access the requested page when a page out operation is in progress.

Figure 5:
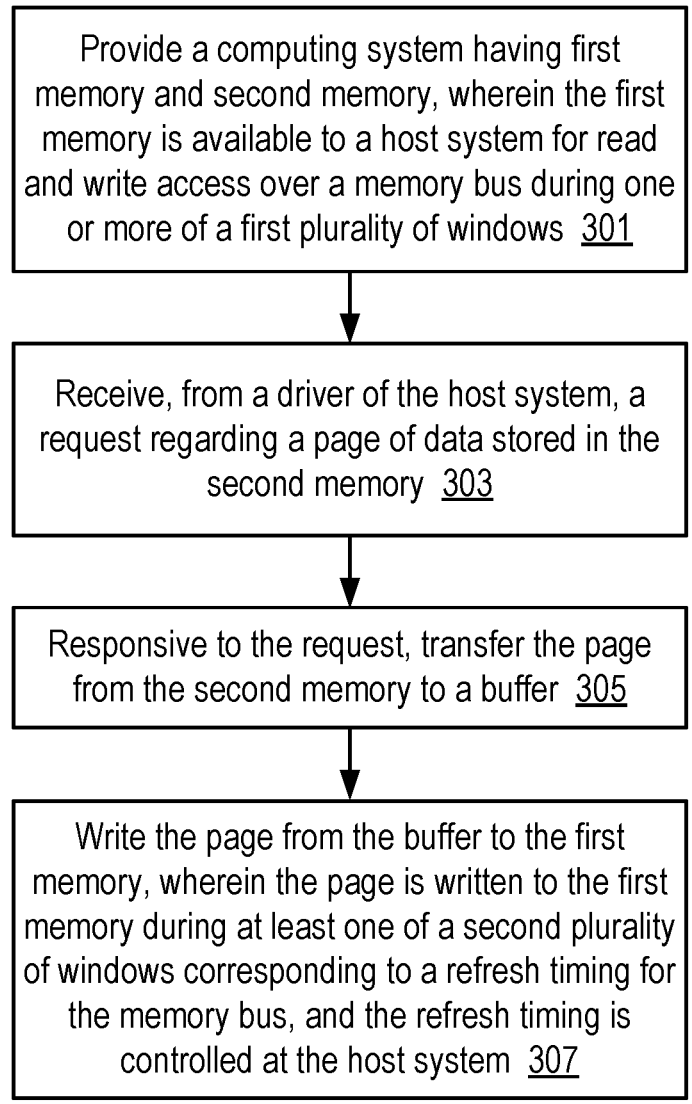
FIG. 5 shows a method for synchronous memory bus access to storage media in accordance with some embodiments of the present disclosure.

FIG. 5 shows a method for synchronous memory bus access to storage media in accordance with some embodiments of the present disclosure. The method of FIG. 5 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method of FIG. 5 is performed at least in part by the synchronization component 113 of FIG. 1 or 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented in a computing system of FIG. 1 or 2 with host system 120 and memory sub-system 110 or memory module 205. In one example, the synchronization component 113 can be implemented at least in part via the memory module 401 of FIG. 3 and the host operating system 241 of FIG. 3.

At block 301 in FIG. 5, a computing system is provided having first memory (e.g., volatile memory 402) and second memory (e.g., non-volatile memory 404). The first memory is available to a host system (e.g. host system 120) for read and write access over a memory bus (e.g. memory bus 203) during one or more windows in a first set of time windows. In one example, the first set of time windows includes regular host cycles in which host system 120 receives DRAM data from memory module 401. In one example, it is noted that tREFI is the time between refresh. A REFRESH cycle (tRFC) is a part of tREFI. Thus, in this example, a regular host cycle where the host can issue read/write commands to DRAM is tREFI-tRFC long.

At block 303, a request regarding a page of data stored in the second memory is received from a driver of the host system. For example, the request is a page in request received from driver 247 of host system 120. For example, the page of data is stored in non-volatile memory 404 (e.g., cross point memory).

At block 305, responsive to the request, the requested page is transferred from the second memory to a buffer. For example, the buffer is buffer 121 or buffer 410, and the page is transferred from non-volatile memory 404.

At block 307, the page is written from the buffer to the first memory. The page is written to the first memory during one or more of a second set of time windows that correspond to a refresh timing for the memory bus. The refresh timing is controlled at the host system. For example, refresh cycles on a DDR channel are configured at the host system 120 so that some refresh cycles can be reserved for transfer to and from buffer 410. In one example, for each total of four refresh cycles, one refresh cycle is used to actually refresh the DRAM memory, and the other three cycles are reserved for transfer to and from buffer 410. For example, host system 120 can be configured so that buffer controller 412 can perform one or more tasks on the DDR4 DRAM in volatile memory 402 in certain reserved refreshing cycles (e.g., tRFC) not used to refresh the DDR4 DRAM. In such cycles, buffer controller 412 can transfer data between DDR4 DRAM and buffer 410.

In one embodiment, a read command for data stored in a page is received by a memory module (e.g., memory module 401) over a memory bus from a host system (e.g., host system 120). In response to receiving the read command, the requested data is sent over the memory bus to the host system.

In one embodiment, a memory module maintains a mapping table (e.g., mapping table 403) including a list of pages mapped to a buffer (e.g., buffer 410). The list includes a page having data that has been requested in a read command from a host system. In response to receiving the read command, a buffer controller (e.g., buffer controller 412) of the memory module determines, based on the mapping table, whether to send the requested data from the buffer or from volatile memory of the memory module (e.g., DDR4 DRAM of volatile memory 402).

In another embodiment, a computing system has first memory 221 and second memory 223. Responsive to a page in request, data in a page in the second memory 223 is copied/loaded to the first memory 221.

For example, the device driver 247 can provide instructions, requests, and/or commands to the memory module 401 to cause the buffer controller 412 to move data between the first memory 221 and the second memory 223.

For example, the first memory 221 and the second memory 223 can be in a same memory module 205 that is connected to a processing device 118 of the computing system via a memory bus 203.

For example, the memory module 205 has excessive memory capacity such that the second memory 223 is not directly addressable on the memory bus 203 by the processing device 118. The first memory 221 is a portion of the memory capacity of the memory module 205 that is directly addressable on the memory bus 203.

For example, the first memory 221 is volatile dynamic random-access memory (DRAM) and the second memory 223 is non-volatile cross-point memory (e.g., 3DXP). The second memory 223 provides a storage function for the first memory 221 that is part of the main memory of the computer system on the memory bus 203. The second memory 223 virtually extends the capacity of the first memory 221 (e.g., DRAM) in the memory module 205 and allows the data in the memory module 205 to be stored even without being powered.

In some implementations, a communication channel between the processing device 118 and a memory sub-system includes a computer network, such as a local area network, a wireless local area network, a wireless personal area network, a cellular communications network, a broadband high-speed always-connected wireless communication connection (e.g., a current or future generation of mobile network link); and the processing device 118 and the memory sub-system can be configured to communicate with each other using data storage management and usage commands similar to those in NVMe protocol.

A memory sub-system in general can have non-volatile storage media. Examples of non-volatile storage media include memory cells formed in an integrated circuit and magnetic material coated on rigid disks. Non-volatile storage media can maintain the data/information stored therein without consuming power. Memory cells can be implemented using various memory/storage technologies, such as NAND logic gate, NOR logic gate, phase-change memory (PCM), magnetic memory (MRAM), resistive random-access memory, cross point storage and memory devices (e.g., 3DXP memory). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

The controller (e.g., 227) of a memory sub-system (e.g., 205) can run firmware to perform operations responsive to the communications from the processing device 118. Firmware in general is a type of computer program that provides control, monitoring and data manipulation of engineered computing devices.

Some embodiments involving the operation of the controller can be implemented using computer instructions executed by the controller, such as the firmware of the controller. In some instances, hardware circuits can be used to implement at least some of the functions. The firmware can be initially stored in the non-volatile storage media, or another non-volatile device, and loaded into the volatile DRAM and/or the in-processor cache memory for execution by the controller.

A non-transitory computer storage medium can be used to store instructions of the firmware of a memory sub-system (e.g., 205) and/or the instructions of the operating system (e.g., 241, 243) in general and the device driver 247 and the hypervisor 245 in particular. In one example, when the instructions are executed by the processing device 118, the instructions cause the processing device 118 to perform a method discussed above.

Figure 6:
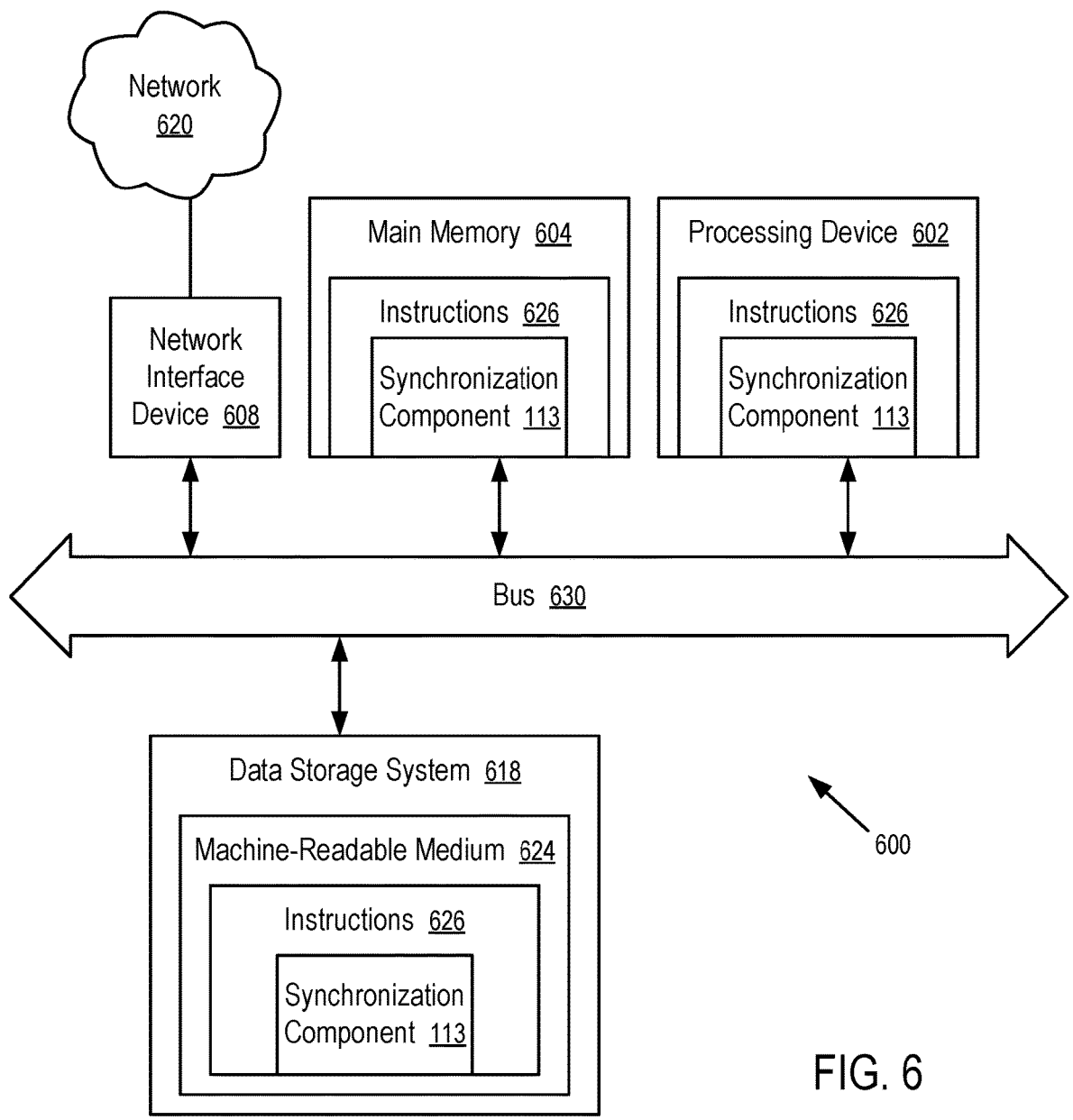
FIG. 6 is a block diagram of an example computer system in which embodiments of the present disclosure can operate.

FIG. 6 is a block diagram of an example computer system 600 in which embodiments of the present disclosure can operate. FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a synchronization component 113 (e.g., to execute instructions to perform operations corresponding to the synchronization component 113 described with reference to FIGS. 1-5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 618, which communicate with each other via a bus 630 (which can include multiple buses).

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a synchronization component 113 (e.g., the synchronization component 113 described with reference to FIGS. 1-5). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A computing system, comprising:
   a plurality of memory components having first memory and second memory, wherein the first memory is available to a host system for read and write access over a memory bus during one or more of a first plurality of windows;
   a processing device, operatively coupled with the plurality of memory components, to:
      receive, from a driver of the host system, a request regarding a page of data stored in the second memory;
      responsive to the request, transfer the page from the second memory to a buffer; and
      write the page from the buffer to the first memory, wherein the page is written to the first memory during at least one of a second plurality of windows corresponding to a refresh timing for the memory bus, and the refresh timing is controlled at the host system.

2. The computing system of claim 1, wherein the page is transferred from the second memory to the buffer during at least one of the first plurality of windows.

3. The computing system of claim 1, wherein the first memory is refreshed during a portion of the second plurality of windows.

4. The computing system of claim 1, wherein the host system is able to access the page of data over the memory bus after the page has been transferred to the buffer.

5. The computing system of claim 1, wherein the page is a first page, the request regarding the page of data is a request to page in the first page, and the processing device is further to:
   receive, from the driver, a request to page out a second page stored in the first memory;
   responsive to the request, write the second page from the first memory to the buffer during at least one of the second plurality of windows; and
   transfer the second page from the buffer to the second memory.

6. The computing system of claim 5, wherein the second page is transferred from the buffer to the second memory during at least one of the first plurality of windows.

7. The computing system of claim 5, wherein the driver provides the request to page out the second page responsive to the driver determining that a number of pages in a mapping table has reached a predetermined limit.

8. The computing system of claim 1, wherein the processing device is further to maintain a mapping table including a list of pages mapped to the buffer, wherein the list includes the page transferred from the second memory to the buffer.

9. The computing system of claim 8, wherein the processing device is further to:
   receive, over the memory bus, a read or write command from a controller of the host system; and determine, based on the mapping table, whether to service the read or write command using the buffer or the first memory.

10. The computing system of claim 1, wherein the driver is configured to maintain at least one mapping table, and the at least one mapping table includes a mapping for the page of data stored in the second memory.

11. The computing system of claim 10, wherein the processing device is further to send a signal indicating completion of transferring the page from the second memory to the buffer, and the driver updates the at least one mapping table responsive to receiving the signal.

12. The computing system of claim 1, wherein a storage capacity of the second memory is greater than a storage capacity of the first memory, and the driver exposes the storage capacity of the second memory to a guest operating system in communication with the host system.

13. The computing system of claim 12, wherein the driver provides the request regarding the page of data stored in the second memory responsive to an access request received by the driver from the guest operating system.

14. The computing system of claim 1, wherein the first memory and the second memory are in a same memory module that is coupled to the host system via the memory bus.

15. The computing system of claim 14, wherein the first memory is directly addressable on the memory bus by the host system, and the second memory is not directly addressable on the memory bus.

16. The computing system of claim 14, wherein the first memory is volatile dynamic random-access memory and the second memory is non-volatile cross-point memory.

17. A method, comprising:
receiving, over a memory bus from a host system, a request regarding a page of data stored in a first memory, wherein a second memory is available to the host system for read and write access over the memory bus during one or more of a first plurality of windows;
responsive to the request, transferring the page from the first memory to a buffer; and
writing the page from the buffer to a second memory, wherein the page is written to the second memory during at least one of a second plurality of windows corresponding to a refresh timing for the memory bus, and the refresh timing is controlled at the host system.

18. The method of claim 17, wherein the page is transferred from the first memory to the buffer during at least one of the first plurality of windows.

19. The method of claim 17, further comprising:
receiving, over the memory bus from the host system, a read command for first data stored in the page; and
responsive to receiving the read command, sending the first data over the memory bus to the host system.

20. The method of claim 19, further comprising:
maintaining a mapping table including a list of pages mapped to the buffer, wherein the list includes the page transferred from the first memory to the buffer; and
responsive to receiving the read command, determining, based on the mapping table, whether to send the first data from the buffer or from the second memory.

* * * * *